(12) United States Patent
Zhao et al.

(10) Patent No.: US 12,546,664 B2
(45) Date of Patent: Feb. 10, 2026

(54) BUILT-IN TEMPERATURE SENSORS

(71) Applicant: GlobalFoundries U.S. Inc., Malta, NY (US)

(72) Inventors: Zhixing Zhao, Dresden (DE); Yiching Chen, Santa Clara, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 606 days.

(21) Appl. No.: 17/896,823

(22) Filed: Aug. 26, 2022

(65) Prior Publication Data
US 2024/0068879 A1  Feb. 29, 2024

(51) Int. Cl.
*G01K 7/01* (2006.01)

(52) U.S. Cl.
CPC ..................... *G01K 7/01* (2013.01)

(58) Field of Classification Search
CPC . G01K 7/01; G01K 7/015; G01K 1/14; H01L 27/0629; H01L 27/0688; H01L 21/761; H01L 21/76283; H01L 23/66; H01L 2223/66; H10D 86/01; H10D 87/00; H10D 89/60; H10D 84/811; H10D 88/00
USPC .................................. 378/174, 179
See application file for complete search history.

(56) References Cited

U.S. PATENT DOCUMENTS

| | | | |
|---|---|---|---|
| 5,508,740 A * | 4/1996 | Miyaguchi | H01L 31/024 348/E5.025 |
| 6,679,628 B2 | 1/2004 | Breinlinger | |
| 8,278,731 B2 | 10/2012 | Summitomo et al. | |
| 9,785,182 B2 | 10/2017 | Patti et al. | |
| 11,081,582 B2 | 8/2021 | Liang et al. | |
| 11,978,740 B2 * | 5/2024 | Chuang | H01L 27/1203 |
| 2009/0066404 A1 | 3/2009 | Heppenstall et al. | |
| 2017/0358692 A1 | 12/2017 | Sun et al. | |
| 2020/0185522 A1 * | 6/2020 | Liang | H01L 29/4916 |
| 2020/0365731 A1 * | 11/2020 | Ko | H01L 23/5286 |

FOREIGN PATENT DOCUMENTS

| | | | | |
|---|---|---|---|---|
| JP | 2001274343 A | * | 10/2001 | ....... H01L 21/76264 |
| KR | 20150122911 A | * | 4/2014 | |

OTHER PUBLICATIONS

Translation of JP 2001274343 (2001).*
JP 2001274343 Translation (Year: 2001).*
European Search Report dated Jan. 30, 2024 in EP Application No. 23184338.4-1020, 5 pages.
M. A. P. Pertijs, et al., "Precision temperature measurement using CMOS substrate pnp transistors," in IEEE Sensors Journal, vol. 4, No. 3, pp. 294-300, Jun. 2004, doi: 10.1109/JSEN.2004.826742, Abstract, 3 pages.

* cited by examiner

*Primary Examiner* — Kristina M Deherrera
*Assistant Examiner* — Evan Mancini
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to built-in temperature sensors and methods of manufacture and operation. The structure includes: a semiconductor on insulator substrate; an insulator layer under the semiconductor on the insulator substrate; a handle substrate under insulator layer; a first well of a first dopant type in the handle substrate; a second well of a second dopant type in the handle substrate, adjacent to the first well; and a back-gate diode at a juncture of the first well and the second well.

20 Claims, 6 Drawing Sheets

BUILT-IN TEMPERATURE SENSORS

BACKGROUND

The present disclosure relates to semiconductor structures and, more particularly, to built-in temperature sensors and methods of manufacture and operation.

A power amplifier is an electronic device that can increase the power of a signal (a time-varying voltage or current). An RF amplifier amplifies a signal in the radio frequency range between 20 kHz and 300 GHz. High frequency RF power amplifiers require the device to be operated at high current density, biased at peak Gm (e.g., above 77 GHz) or peak Fmax (e.g., >350 GHz). This, in turn, results in high heat generation and, in some instances, over-heating of the device/circuit. For example, the temperature rise of the power amplifier due to heat generated during circuit operations can degrade the power amplifier performance and can even impact circuitry at the proximity of the heat source.

SUMMARY

In an aspect of the disclosure, a structure comprises: a semiconductor on insulator substrate; an insulator layer under the semiconductor on the insulator substrate; a handle substrate under insulator layer; a first well of a first dopant type in the handle substrate; a second well of a second dopant type in the handle substrate, adjacent to the first well; and a back-gate diode partially in the first well.

In an aspect of the disclosure, a structure comprises: a heat generating device on a fully depleted semiconductor on insulator (FDSOI) substrate; a back-gate diode at least in a first well under the FDSOI substrate; and temperature sensing circuitry coupled to the back-gate diode configured to determine a temperature of the heat generating device.

In an aspect of the disclosure, a method comprises: establishing a temperature of a heat generating device in an off state; biasing a back-gate diode by applying a voltage to a well under the heat generating device; detecting a current at the back-gate diode during the biasing; and converting the current to a temperature reading of the heat generating device.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1 shows a built-in temperature sensor and respective fabrication processes in accordance with aspects of the present disclosure.

FIG. 2A shows a built-in temperature sensor and respective fabrication processes in accordance with aspects of the present disclosure.

FIG. 2B shows an electrical schematic diagram of the built-in temperature sensor of FIG. 2A, and the operation of the circuit.

FIG. 3 shows a built-in temperature sensor in accordance with additional aspects of the present disclosure.

FIG. 4 shows an electrical schematic diagram of the built-in temperature sensor of FIG. 3, in operation during application of a back-gate bias.

FIG. 5 shows an electrical schematic diagram of the built-in temperature sensor of FIG. 3, in operation when a back-gate bias is not used or the bias is set to zero.

FIG. 6 shows a chart simulating temperature conditions for a reverse bias operation.

FIG. 7 shows a chart simulating temperature condition for a forward bias operation.

DETAILED DESCRIPTION

The present disclosure relates to semiconductor structures and, more particularly, to built-in temperature sensors and methods of manufacture. In embodiments, the built-in temperature sensors may be provided in RF/mmW power amplifiers. The RF/mmW power amplifiers may be provided in fully-depleted semiconductor-on-insulator (FDSOI) technologies. For example, the built-in temperature sensors may include a back-gate diode or bipolar junction transistor (BJT) sensor in FDSOI. Advantageously, the built-in temperature sensors can provide in situ temperature monitoring at low cost, e.g., no additional masks needed, with little to no impact on device design.

In embodiments, the built-in temperature sensors monitor the temperature changes at the device level in order to characterize the heating behavior of a power amplifier. The built-in temperature sensors may be used in conjunction with additional temperature detection circuitry for sensing the temperature during circuit operation. The built-in temperature sensors may be, for example, a diode coupled to a biasing/sensing circuitry. In more specific embodiments, the built-in temperature sensors may be a diode formed in a substrate of a BJT, to in situ monitor the device temperature during device operations without impact on the device operation especially for RF performance.

The built-in temperature sensors of the present disclosure can be manufactured in a number of ways using a number of different tools. In general, though, the methodologies and tools are used to form structures with dimensions in the micrometer and nanometer scale. The methodologies, i.e., technologies, employed to manufacture the built-in temperature sensors of the present disclosure have been adopted from integrated circuit (IC) technology. For example, the structures are built on wafers and are realized in films of material patterned by photolithographic processes on the top of a wafer. In particular, the fabrication of the built-in temperature sensors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material lines as is known in the art.

FIG. 1 shows a built-in temperature sensor and respective fabrication processes in accordance with aspects of the present disclosure. More specifically, the structure 10 of FIG. 1 includes substrate 12. The substrate 12 may be a semiconductor-on-insulator (SOI) substrate. For example, the semiconductor-on-insulator (SOI) substrate 12 includes a handle substrate **12*a* composed of any suitable material including, but not limited to, Si, SiGe, SiGeC, SiC, GaAs, InAs, InP, and other III/V or II/VI compound semiconductors. In embodiments, the handle substrate 12*a* may be a p-type substrate. An insulator layer 12*b* may be over the handle substrate 12. The insulator layer 12*b* comprises any suitable material, including silicon oxide, sapphire, other suitable insulating materials, and/or combinations thereof. An exemplary insulator layer 12*b* may be a buried oxide layer (BOX). A semiconductor substrate 12*c*** may be provided over the insulator layer 12b. The semiconductor substrate 12c may be a fully depleted silicon-on-insulator (FDSOI) substrate, as an example. The handle substrate 12a provides mechanical support to the insulator layer 12b and the semiconductor substrate 12c.

An N-well 14 (e.g., back-gate well) and P-well 16 may be provided in the handle substrate 12a. The N-well 14 and P-well 16 may be formed by separate ion implantation processes as is known in the art. For example, the N-well 14 may be formed by introducing a concentration of an N-type dopant in the handle substrate 12a; whereas the P-well 16 may be formed by introducing a concentration of a P-type dopant in the handle substrate 12a. For example, the N-well 14 may be doped with n-type dopants, e.g., Arsenic (As), Phosphorus (P) and Antimony (Sb), among other suitable examples. In embodiments, the P-well 16 may be doped with p-type dopants, e.g., Boron (B).

In both implantation processes, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. An annealing process may be performed to drive in the dopant into the handle substrate 12a, e.g., into the wells 14, 16.

Figure 1:
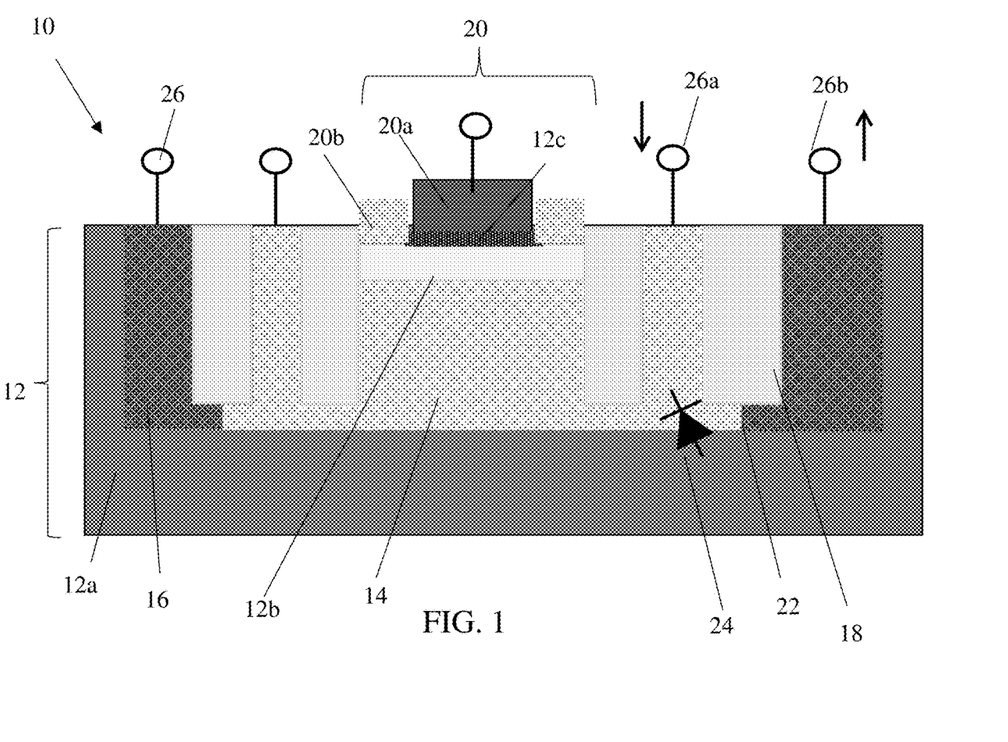

Still referring to FIG. 1, shallow trench isolation structures 18 may be provided within the handle substrate 12a to separate or isolate the P-well 16 from the N-well 14, and the N-well 14 from a device 20 (e.g., a transistor or other heat generating device, e.g., for a power amplifier). The shallow trench isolation structures 18 may extend partially through the N-well 14, thereby resulting in a PN junction 22 between the P-well 16 and the N-well 14. This configuration will effectively form a back-gate diode 24 within the handle substrate 12a at the PN junction 22.

The shallow trench isolation structures 18 can be formed by conventional lithography, etching and deposition methods known to those of skill in the art. For example, a resist formed over the handle substrate 12a is exposed to energy (light) to form a pattern (opening). An etching process with a selective chemistry, e.g., reactive ion etching (RIE), will be used to transfer the pattern to the handle substrate 12a, forming one or more trenches in the handle substrate 12a. Following the resist removal by a conventional oxygen ashing process or other known stripants, insulator material (e.g., $SiO_2$) material can be deposited by any conventional deposition processes, e.g., chemical vapor deposition (CVD) processes. Any residual material on the surface of the handle substrate 12a can be removed by conventional chemical mechanical polishing (CMP) processes.

The device 20, e.g., gate structure or other heat generating device of a power amplifier, may be formed on the semiconductor substrate 12c (e.g., FDSOI). In embodiments, the device 20 may be a BJT. In embodiments, the device 20 may comprise a polysilicon gate body 20a with adjacent source/drain regions 20b. The device 20, e.g., gate structure, may include sidewall spacers which isolate the gate body 20a from the source/drain regions 20b. The gate structure 20 further includes a gate dielectric material, e.g., high-k or low-k dielectric material. The high-k gate dielectric material can be, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The source/drain regions 20b may be raised source/drain regions 20b fabricated using, for example, conventional epitaxial growth processes with an in-situ dopant, e.g., n-type dopant. In accordance with exemplary embodiments, epitaxy regions (e.g., raised source/drain regions 20b) may include SiGe or Si; although other III-V compound semiconductors or combinations thereof are contemplated herein. An annealing process may be performed to drive in the dopant.

Terminal connection 26 may be provided to the gate body 20a and wells 14, 16. The arrow adjacent the terminal connection 26a provides a current to the N-well 14 and, hence the back-gate diode 24. On the other hand, the terminal connection 26b may be used to check leakage current from the P-well 16 as depicted by the arrow pointing away from the P-well 16 which is adjacent to the terminal connection 26b.

The terminal connections 26 may include a silicide and metal contacts, e.g., tungsten with a TaN or TiN liner or other conductive material. As should be understood by those of skill in the art, the silicide process begins with deposition of a thin transition metal layer, e.g., nickel, cobalt or titanium, over fully formed and patterned semiconductor devices (e.g., gate structure and wells 14, 16. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts. It should be understood by those of skill in the art that silicide contacts can also be provided on the source/drain regions 20b (but is not shown in this view).

Figure 2A:
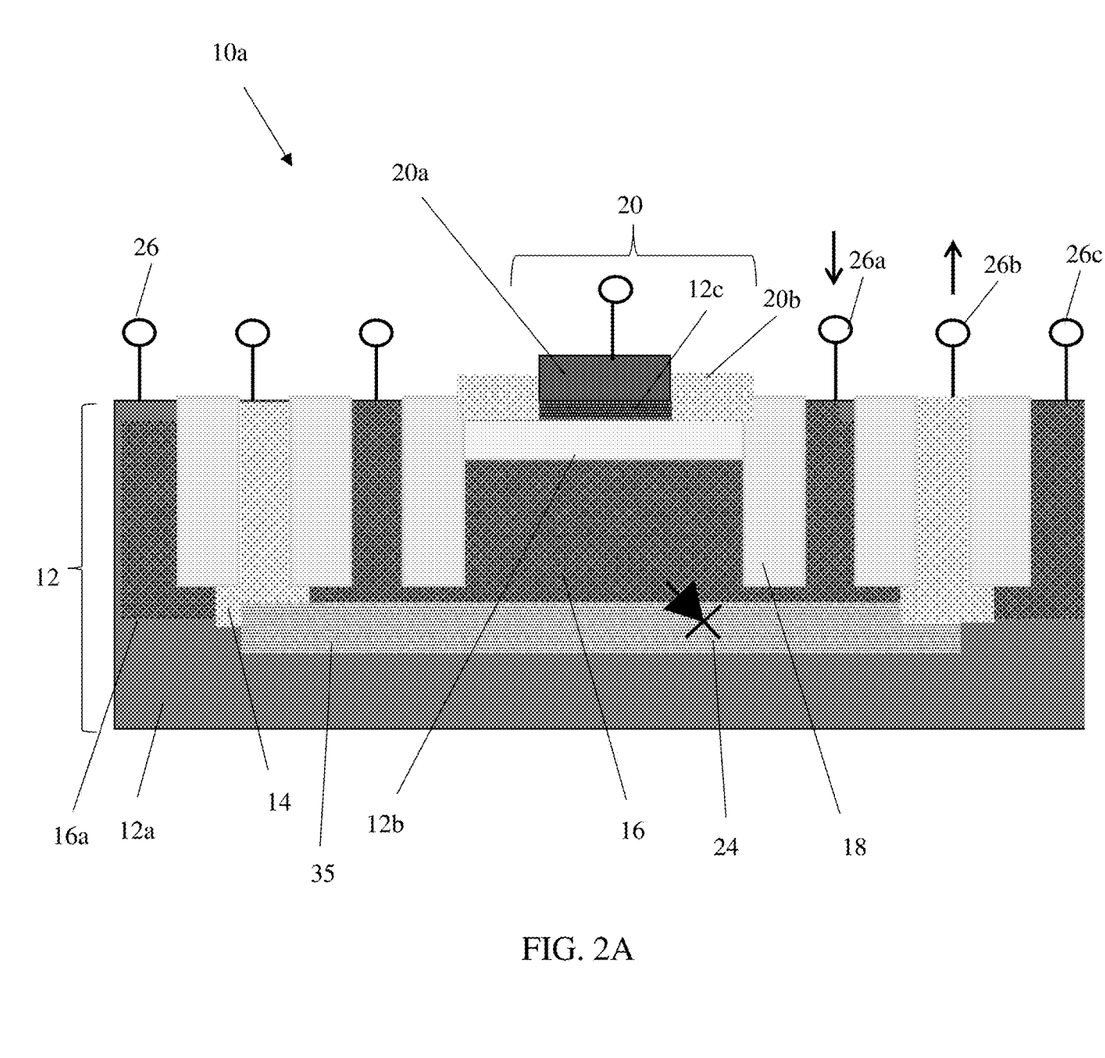

FIG. 2A shows a built-in temperature sensor with a triple well, e.g., N-well 35 and additional P-well 16a. More specifically, the device 10a shows a deep N-well 35 in the handle substrate 12a underneath and contacting both the N-well 14 and P-well 16. In this embodiment, the back-gate diode 24 may be provided within the handle substrate 12a formed by the junction of the deep N-well 35 and the P-well 16. The N-well 14 and P-wells 16, 16a and, in this embodiment, the deep N-well 35, may be formed by an ion-implantation processes as is known in the art. The terminal connections 26 may be provided to the gate body 20a and wells 14, 16, 16a. A terminal connection 26c may provide current to an outer P-well 16a. As already described herein, the terminal connections 26 may include a silicide and metal contacts, e.g., tungsten with a TaN or TiN liner or other conductive material. The remaining features are similar to the structure 10 shown in FIG. 1.

Figure 2B:
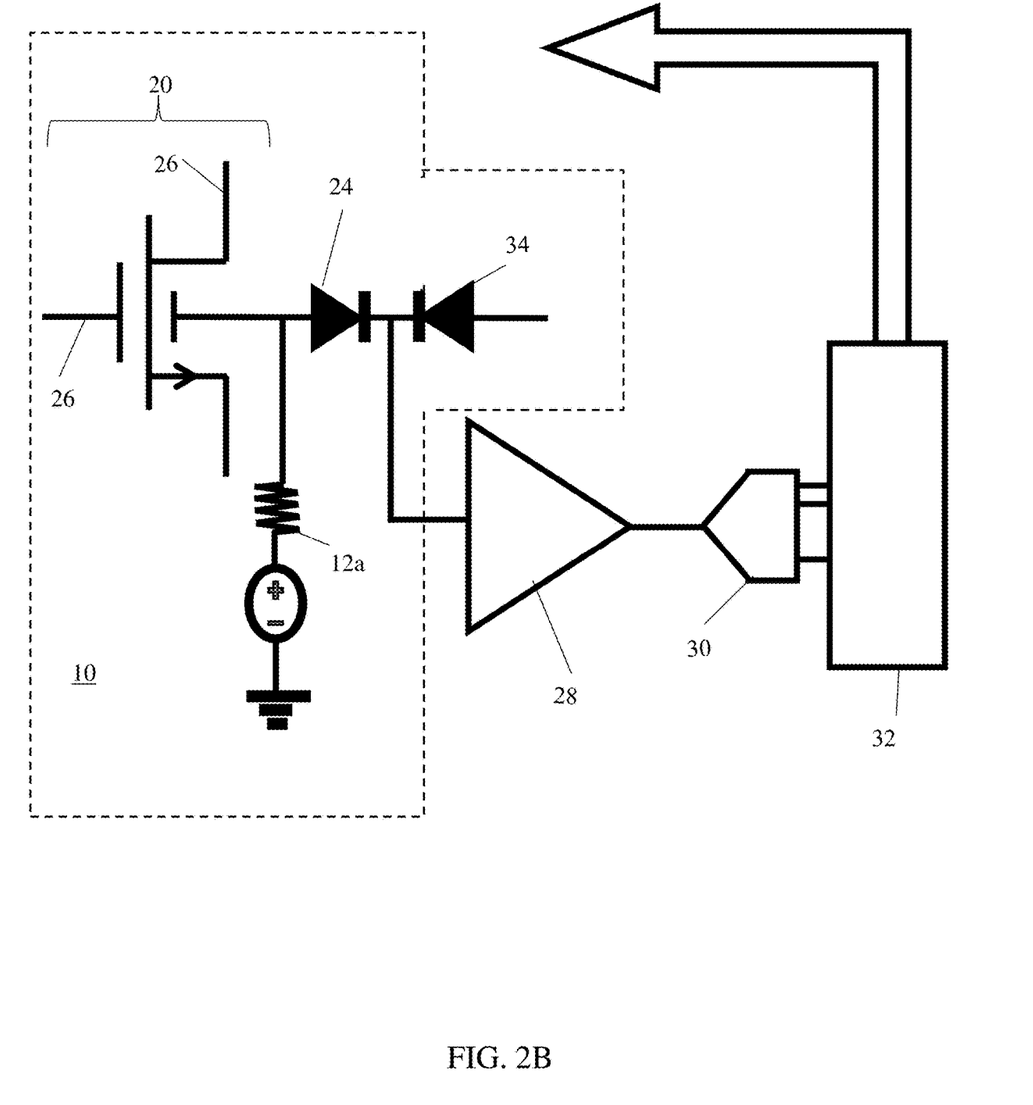

In operation and as shown schematically in the electrical schematic of FIG. 2B, the back-gate diode 24 can be exploited as a temperature sensor on FDSOI technology. For example, with in-situ monitoring, as the back-gate well 14 is applied a voltage (normally, it would be a reserve biasing), the current at the back-gate diode 24 can be recorded for estimating/evaluating ambient temperatures of the device according to the following equation:

$$I = I_O\left(e^{\frac{qV}{nkT}} - 1\right)$$

wherein: I and V are diode current and voltage, respectively; Io is the reverse saturation current; q is the charge on the electron; n is the ideality factor (n=1 for indirect semiconductors (Si, Ge, etc.) and n=2 for direct semiconductors (GaAs, InP, etc.)); k is Boltzmann's constant; T is temperature in Kelvin; and kT/q is thermal voltage.

In more specific embodiments, in the sequencing of monitoring the temperature, when a voltage is not applied to the back of the device 20, e.g., back-gate voltage, the monitoring scheme may implement a sequence for device operation and temperature sensing. For example, once the device 20 is off, the back-gate diode 24 can be either forward biased or reserve biased to detect a current and hence a temperature. The resistor shown in FIG. 2B is representative of the resistance of the handle substrate 12a. In this embodiment (e.g., triple well device), both the diodes 24, 34 are part of the device construction. Also, in FIG. 2B, the temperature sensor diode can be used as diode 24 while the diode 34 is not used during temperature sensing. (In the device 10 of FIG. 1, there is no triple well and hence diode 34 would not be part of the device). It should also be understood that the operations described herein are also applicable to the device 10 of FIG. 1.

As further shown in FIG. 2B, a transimpedance detection circuit 28, ADC converter 30 and digital controller 32 may be provided outside of the device 20 (as represented by the dashed box). The transimpedance detection circuit 28 may detect a current drop during a biasing, e.g., forward biasing. The "forward biasing" in FIG. 2A refers to the case when the bias from the voltage source provides a positive voltage so that the diode 24 is ON. Thus, the ON current through diode 24 can flow into the transimpedance amplifier 28 and be converted to a voltage signal. Then such voltage signal can be translated into digital signal via the ADC 30, which is provided to the digital controller 32. The digital controller 32 may be used to provide a control feedback based on a temperature reading of the device 10a (or device 10). An optional calibration step may be provided to record/establish the amplifier OFF temperature. In other words, the calibration step may be used to record the forward-biasing current before powering up the amplifier (e.g., device 20). The benefit of such operation is that the monitoring has no impact/interruption on the circuit operations since the back-gate is normally applied to reserve bias the back-gate well 14.

Figure 3:
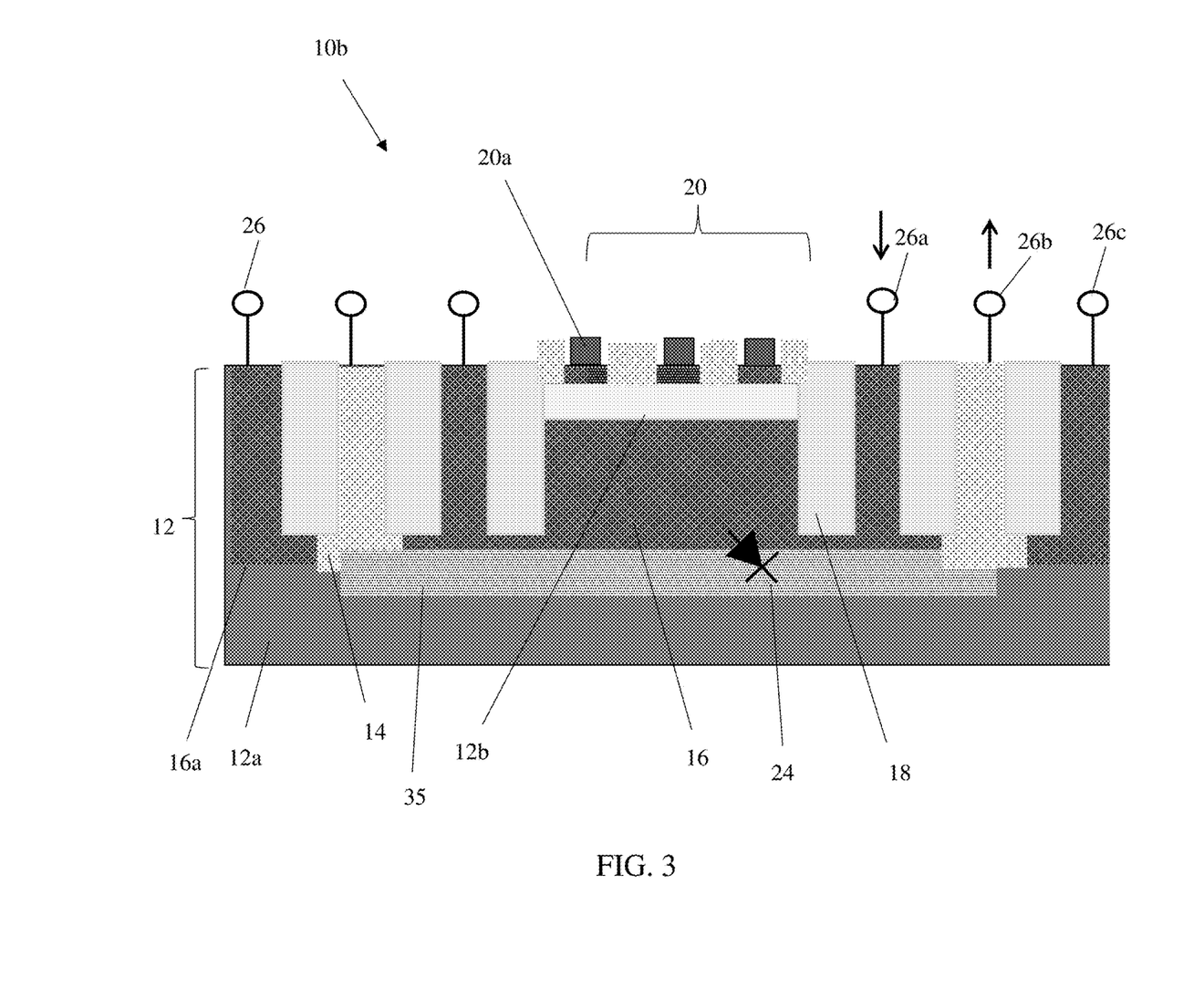

FIG. 3 shows a built-in temperature sensor and respective fabrication processes in accordance with a triple-well, similar to that described with respect to FIG. 2A. More specifically, the structure 10b of FIG. 3 includes the substrate 12 which, as in the previous embodiment, the substrate 12 may be a semiconductor on insulator (SOI) substrate which includes the handle substrate 12a, insulator layer 12b on the handle substrate 12a and the semiconductor substrate 12c. The semiconductor substrate 12c may be a fully depleted silicon-on-insulator (FDSOI) substrate, as an example. In this embodiment, the device 20 may be one or more transistors of a power amplifier as representatively shown in FIG. 3, each of which are similar to that described with respect to FIG. 1 as an illustrative example.

An N-well 14 and P-wells 16, 16a are provided in the handle substrate 12a. In this embodiment, the N-well 14 is isolated between the two P-wells 16, 16a, with the P-well 16 under the device 20. Accordingly, the P-well 16 may act as a back-gate well to the device 20. A deep N-well 35 may be provided in the handle substrate 12a underneath and contacting both the N-well 14 and P-well 16. In this embodiment, the back-gate diode 24 may be provided within the handle substrate 12a formed by the junction of the deep N-well 35 and the P-well 16. As previously described, the N-well 14 and P-wells 16, 16a and, in this embodiment, the deep N-well 35, may be formed by an ion-implantation processes as is known in the art.

Similar to FIG. 2A shallow trench isolation structures 18 may be provided within the handle substrate 12a to separate or isolate the P-wells 16a, 16 from the N-well 14, and the P-well 16 from the device 20. The terminal connections 26 may be provided to the gate body 20a and wells 14, 16, 16a. The arrow adjacent to the terminal connection 26a provides a current (voltage) to the P-well 16 and, hence the back-gate diode 24. On the other hand, the contact 26b may be used to check leakage current from the N-well 14 as depicted by the arrow pointing away from the N-well 14 adjacent to the contact 26b. A terminal connection 26c may provide current to the outer P-well 16a. As already described herein, the terminal connections 26 may include a silicide and metal contacts, e.g., tungsten with a TaN or TiN liner or other conductive material.

Figure 4:
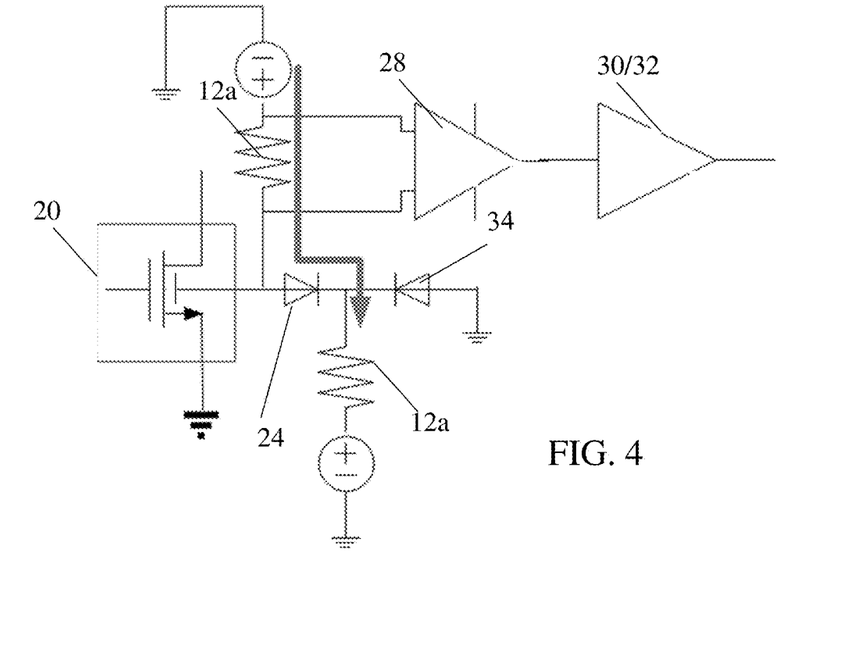

FIG. 4 shows an electrical schematic diagram of the built-in temperature sensor of FIG. 3, in operation during application of a back-gate bias. In this operation, an optional calibration step may be provided to record/establish the amplifier OFF temperature. In other words, the calibration step may be used to record the forward-biasing current before powering up the amplifier (e.g., device 20). The voltage can be adjusted for the N-well 14 to forward bias the diode 24 as shown by the arrow in FIG. 4. In this way, it is possible to detect the current to determine the temperature of the device 20.

To save power consumption, the diode 24 does not have to be ON or forward-biased all the time (e.g., by adjusting the voltage of the N-well 14); instead, the diode 24 can be ON only when the current needs to be detected. The temperature information during the amplifier operation can be fed back to control circuitry 28, 30, 32 as described above in to determine the temperature and adjust the biasing for cooling the device temperature.

Figure 5:
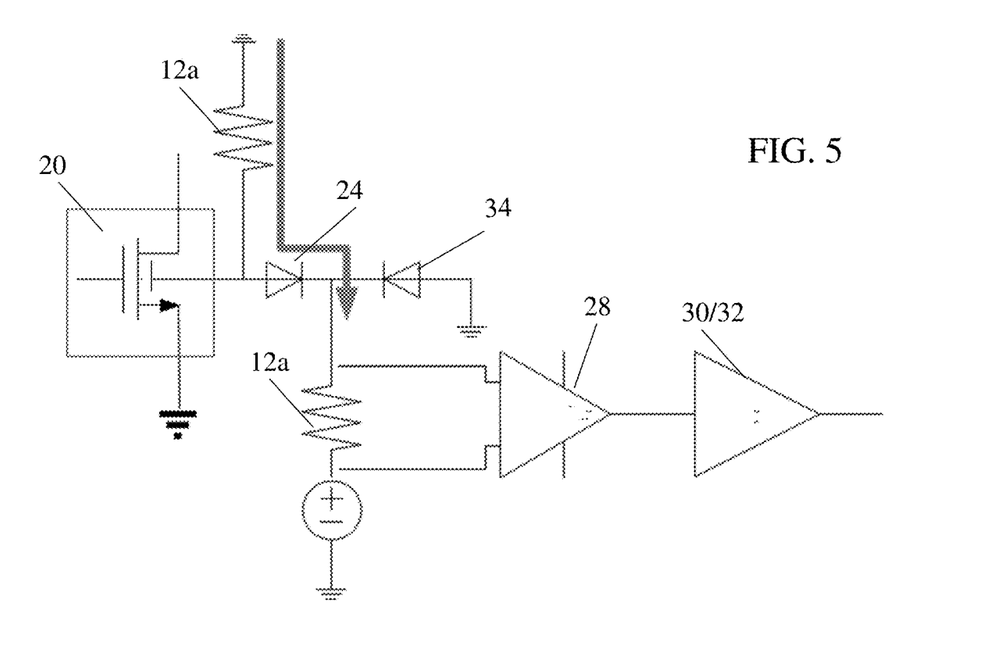

FIG. 5 shows an electrical schematic diagram of the built-in temperature sensor of FIG. 3, in operation when a back-gate bias is not used or the bias is set to zero. In this operation, the optional calibration step may be provided to record/establish the amplifier OFF temperature. For example, the amplifier (e.g., device 20) can be turned OFF within a short amount of time and then the back-gate can forward-bias the diode 24 to detect the temperature of the device 20. This is shown by the arrow in FIG. 5. The temperature information during the amplifier operation can be fed back to control circuitry 28, 30, 32 as described above in to adjust the biasing for cooling the amplifier temperature.

Figure 6:
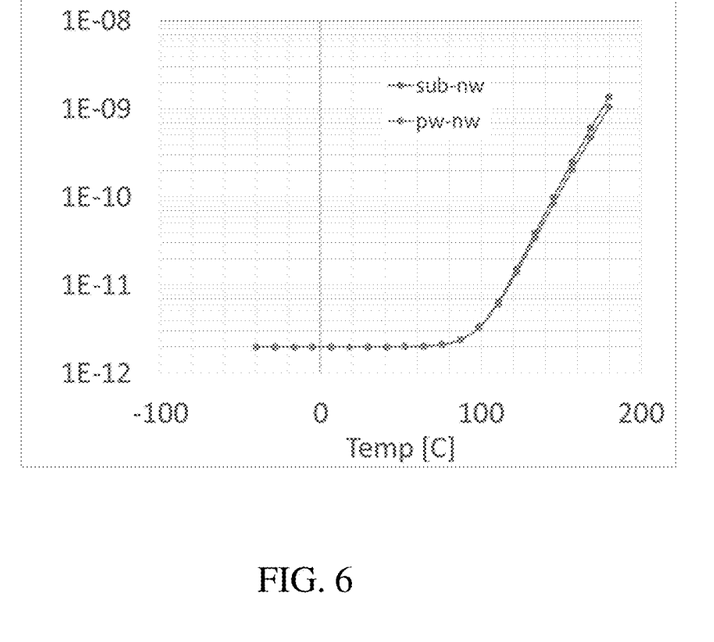

FIG. 6 shows a chart simulating temperature conditions for a reverse bias operation. In FIG. 6, the Y-axis is current and the X-axis is temperature. As shown in FIG. 6 during a reverse biasing, in operation, as temperature increases past 100° C., the current also increases.

Figure 7:
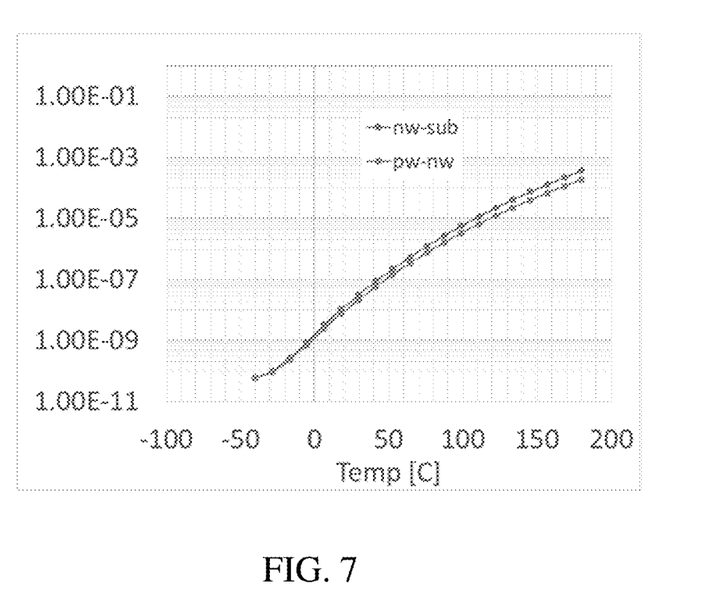

FIG. 7 shows a chart simulating temperature condition for a forward bias operation. In FIG. 7, the Y-axis is current and the X-axis is temperature. As shown in FIG. 7 during a forward biasing, in operation, as temperature increases, the current also increases.

The built-in temperature sensors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor on insulator substrate;
   an insulator layer under the semiconductor on the insulator substrate;
   a handle substrate under the insulator layer;
   a first well of a first dopant type in the handle substrate;
   a second well of a second dopant type in the handle substrate, adjacent to the first well; and
   a back-gate diode partially in the first well.

2. The structure of claim 1, wherein the first dopant type of the first well comprises a n-type dopant and the second dopant type of the second well comprises a p-type dopant.

3. The structure of claim 2, wherein the back-gate diode is at a junction of the first well and the second well.

4. The structure of claim 1, further comprising shallow trench isolation regions within the handle substrate separating the first well from the second well.

5. The structure of claim 4, wherein the shallow trench isolation regions further separate a heat generating device on the semiconductor on insulator substrate from the first well.

6. The structure of claim 1, wherein the semiconductor on insulator substrate is fully depleted.

7. The structure of claim 1, wherein the first dopant type of the first well comprises a p-type dopant and the second dopant type of the second well comprises a deep N-well.

8. The structure of claim 7, further comprising a third well comprising a p-type dopant and a fourth well comprising an n-type dopant which isolates the third well from the first well.

9. The structure of claim 8, further comprising shallow trench isolation structures isolating the first well from the fourth well and the third well from the fourth well.

10. The structure of claim 1, further comprising biasing and sensing circuitry coupled to the back-gate diode.

11. The structure of claim 10, wherein the sensing circuitry comprises a transimpedance detection circuit, ADC converter and digital controller.

12. A structure comprising:
    a heat generating device on a fully depleted semiconductor on insulator (FDSOI) substrate;
    a back-gate diode at least in a first well under the FDSOI substrate; and
    temperature sensing circuitry coupled to the back-gate diode configured to determine a temperature of the heat generating device.

13. The structure of claim 12, wherein the heat generating device comprises a transistor of a power amplifier.

14. The structure of claim 12, wherein the first well is under the FDSOI substrate and is a back-gate well of the heat generating device, and the first well comprises a first dopant type.

15. The structure of claim 14, wherein the first dopant type comprises an n-type dopant, and further comprising a second well comprises a p-type dopant adjacent to the first well.

16. The structure of claim 14, wherein the first dopant type comprises a p-type dopant, and further comprising a second well comprising an n-type dopant adjacent to the first well and a deep N-well under the first well and the second well.

17. The structure of claim 16, wherein the back-gate diode extends in the first well and the deep N-well.

18. The structure of claim 12, wherein the sensing circuitry comprises a transimpedance detection circuit.

19. The structure of claim 18, wherein the transimpedance detection circuit is configured to detect a current drop during a biasing of the back-gate diode.

20. A method, comprising:
    establishing a temperature of a heat generating device in an off state, the heat generating device being on a fully depleted semiconductor on insulator (FDSOI) substrate:
    forward biasing a back-gate diode by applying a voltage to a well in the FDSOI substrate and being under the heat generating device;
    detecting a current drop at the back-gate diode during the forward biasing using a transimpedance detection circuit; and
    converting the current to a temperature reading of the heat generating device.

* * * * *